United States Patent
Lee et al.

(10) Patent No.: US 8,749,270 B2
(45) Date of Patent: Jun. 10, 2014

(54) DRIVER CIRCUIT OF SEMICONDUCTOR APPARATUS AND METHOD FOR CONTROLLING THE SAME

(75) Inventors: Myung Hwan Lee, Icheon-si (KR); Shin Ho Chu, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/333,018

(22) Filed: Dec. 21, 2011

(65) Prior Publication Data

US 2012/0249214 A1    Oct. 4, 2012

(30) Foreign Application Priority Data

Mar. 31, 2011    (KR) .................. 10-2011-0029688

(51) Int. Cl.
*H03K 19/0175* (2006.01)

(52) U.S. Cl.
USPC .............................. 326/82; 326/86

(58) Field of Classification Search
USPC ...................................... 326/82–87
See application file for complete search history.

(56) References Cited

U.S. PATENT DOCUMENTS

| 6,677,797 B2 * | 1/2004 | Kameyama et al. .......... 327/333 |
| 2007/0210779 A1 * | 9/2007 | Itoh ............................... 323/284 |

FOREIGN PATENT DOCUMENTS

| KR | 1019960008282 B1 | 6/1996 |
| KR | 10-1997-0051278 A | 7/1997 |
| KR | 10-1997-0055517 A | 7/1997 |
| KR | 10-2001-0100940 A | 11/2001 |

* cited by examiner

*Primary Examiner* — Thienvu Tran
(74) *Attorney, Agent, or Firm* — William Park & Associates Patent Ltd.

(57) ABSTRACT

A driver circuit of a semiconductor apparatus includes a driver and a control unit configured to vary a voltage level of a power supply terminal of the driver in response to a standby mode signal.

3 Claims, 2 Drawing Sheets

DRIVER CIRCUIT OF SEMICONDUCTOR APPARATUS AND METHOD FOR CONTROLLING THE SAME

CROSS-REFERENCES TO RELATED APPLICATION

The present application claims priority under 35 U.S.C. §119(a) to Korean application number 10-2011-0029688, filed on Mar. 31, 2011 in the Korean Intellectual Property Office, which is incorporated by reference in its entirety.

BACKGROUND

1. Technical Field

The present invention relates to a semiconductor apparatus, and more particularly, to a driver circuit of a semiconductor apparatus and a method for controlling the same.

2. Related Art

A semiconductor apparatus basically requires high energy efficiency, a minimum heat generation, and a long operation time.

In particular, in the case of mobile products operated by a battery, a low-power consumption characteristic is an important factor for evaluating the products.

A semiconductor apparatus includes a variety of drivers for inputting and outputting signals.

A conventional driver 1 is configured to drive an output terminal OUT using a power supply voltage VDDA applied to a source, controlled by a voltage level of an input terminal IN connected to a gate.

The same power supply voltage VDDA is applied to the source and a bulk terminal of the driver 1.

The driver 1 receives an input signal having the voltage level of the power supply voltage VDDA through the input terminal IN in a normal state.

The driver 1 receives an input signal having the voltage level of a ground voltage VSSA through the input terminal IN, and performs a pull-up operation of driving the output terminal OUT to the voltage level of the power supply voltage VDDA.

However, the conventional driver 1 has insufficient drivability in a normal mode, and the leakage current amount increases in a standby mode.

SUMMARY

A driver circuit of a semiconductor apparatus, which is capable of reducing a leakage current amount in a standby mode and improving drivability in a normal mode, and a method for controlling the same are described.

In one embodiment of the present invention, a driver circuit of a semiconductor apparatus includes a driver, and a control unit configured to vary a voltage level of a power supply terminal of the driver in response to a standby mode signal.

In another embodiment of the present invention, a driver circuit of a semiconductor apparatus includes a driver configured to receive a first power supply voltage through a bulk terminal and receive one of a second and third power supply voltage through a source terminal, and a control unit configured to generate the first to third power supply voltages and selectively output one of the second and third power supply voltages in response to a standby mode signal.

In another embodiment of the present invention, a driver circuit of a semiconductor apparatus includes a driver, and a control unit configured to apply a negative bias voltage between an input terminal and a power supply terminal of the driver when the semiconductor apparatus is in a standby mode.

In another embodiment of the present invention, a method for controlling a driver of a semiconductor apparatus includes determining whether to change an operation mode of the semiconductor apparatus, and varying voltage applied to a power supply terminal of the driver when the operation mode is changed.

BRIEF DESCRIPTION OF THE DRAWINGS

Features, aspects, and embodiments are described in conjunction with the attached drawings.

DETAILED DESCRIPTION

A driver circuit of a semiconductor apparatus and a method for controlling the same according to various embodiments of the present invention will be described below with reference to the accompanying drawings.

Figure 1:
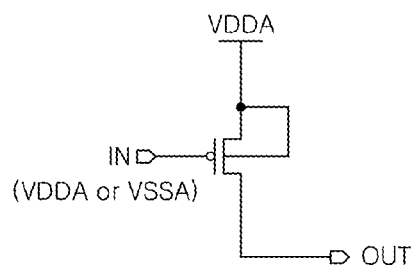
FIG. 1 is a circuit diagram of a conventional driver.
Figure 2:
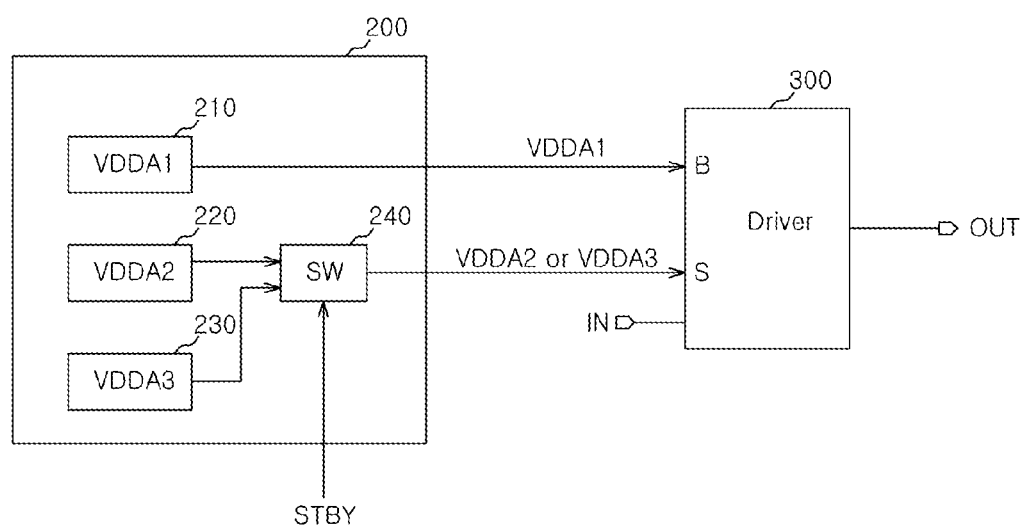
FIG. 2 is a block diagram of an exemplary driver circuit of a semiconductor apparatus according to one embodiment.

Referring to FIG. 2, a driver circuit 100 of a semiconductor apparatus according to one embodiment includes a control unit 200 and a driver 300.

The driver 300 is configured to receive independent power supply voltages through a source terminal and a bulk terminal.

The driver 300 is configured to drive an output terminal OUT using the power supply voltage applied to the source terminal, in response to a voltage level of an input terminal IN which is applied to a gate terminal (hereinafter, referred to as a gate).

The control unit 200 is configured to generate first to third power supply voltages VDDA1 to VDDA3 and provide the generated power supply voltages to the driver 300.

The control unit 200 is configured to provide the first power supply voltage VDDA1 to the bulk terminal of the driver 300.

The control unit 200 is configured to provide the second or third power supply voltage VDDA2 or VDDA3 to the source terminal of the driver 300 in response to a standby mode signal STBY.

The control unit 200 includes first to third voltage generators 210 to 230 and a switch 240.

The first to third voltage generators 210 to 230 are configured to generate first to third power supply voltages VDDA1 to VDDA3, respectively.

The first to third power supply voltages VDDA1 to VDDA3 are generated by using an external voltage VDD, and may have a relation of VDDA3<VDDA1<VDDA2.

The switch 240 is configured to provide the second or third power supply voltage VDDA2 or VDDA3 to the source terminal of the driver 300 in response to the standby mode signal STBY.

The switch 240 provides the second power supply voltage VDDA2 to the source terminal of the driver 300 when the standby mode signal STBY is deasserted.

The switch 240 provides the third power supply voltage VDDA3 to the source terminal of the driver 300 when the standby mode signal STBY is asserted.

At this time, the standby mode STBY is a signal for defining an operation state (normal mode/standby mode) of the semiconductor apparatus, and may include a power down signal of the semiconductor apparatus.

Figure 3:
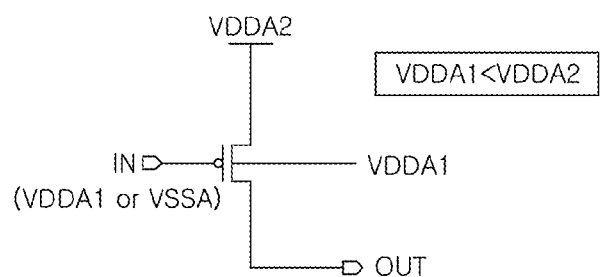
FIG. 3 is a circuit diagram illustrating a voltage application method of a driver of FIG. 2 in a normal mode.

FIG. 3 is a circuit diagram illustrating a voltage application method of the driver 300 of FIG. 2 in the normal mode.

Referring to FIG. 3, the driver 300 receives independent power supply voltages through the source terminal and the bulk terminal.

In the normal mode, the driver 300 receives the second power supply voltage VDDA2 through the source terminal and receives the first power supply voltage VDDA1 through the bulk terminal.

Furthermore, the driver 300 receives an input signal having the voltage level of the first power supply voltage VDDA1 or an input signal having the voltage level of a ground voltage VSSA through the input terminal IN.

The driver 300 performs a pull-up operation in response to an input signal having the voltage level of the ground voltage VSSA. That is, the driver 300 drives the output terminal OUT to the voltage level of the second power supply voltage VDDA2.

The second power supply voltage VDDA2 has a higher voltage level than the first power supply voltage VDDA1. That is, the source terminal voltage level is higher than the bulk terminal voltage level.

Therefore, a gate-source voltage difference increases, and a threshold voltage decreases. Accordingly, it is possible to increase a current drivability of the driver 300.

Figure 4:
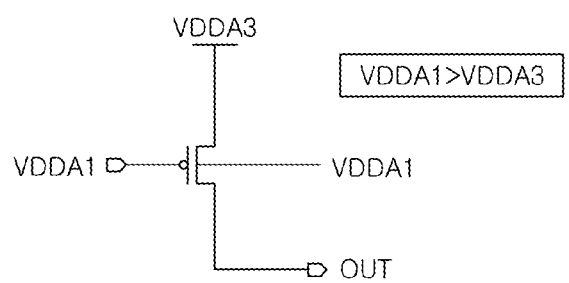
FIG. 4 is a circuit diagram illustrating a voltage application method of the driver 300 of FIG. 2 in a standby mode.

FIG. 4 is a circuit diagram illustrating a voltage application method of the driver 300 of FIG. 2 in the standby mode.

Referring to FIG. 4, the driver 300 receives independent power supply voltages through the source terminal and bulk terminal.

In the standby mode, the driver 300 receives the third power supply voltage VDDA3 through the source terminal, and receives the first power supply voltage VDDA1 through the bulk terminal.

Furthermore, the input terminal IN is maintained at the voltage level of the first power supply voltage VDDA1.

The third power supply voltage VDDA3 has a lower voltage level than the first power supply voltage VDDA1.

Since the source terminal voltage level of the driver 300 becomes lower than the bulk terminal voltage level and the gate voltage level, a negative bias is applied between the gate and source.

In the standby mode, a negative bias voltage is applied between the gate terminal and the source terminal, and the gate-source voltage difference is reduced to increase the threshold voltage. Therefore, it is possible to reduce a leakage current.

According to the embodiments of the present invention, it is possible to reduce a leakage current amount in a standby mode and improve drivability in a normal mode.

While certain embodiments have been described above, it will be understood to those skilled in the art that the embodiments described are by way of example only. Accordingly, the driver circuit and method described herein should not be limited based on the described embodiments. Rather, the driver circuit and method described herein should only be limited in light of the claims that follow when taken in conjunction with the above description and accompanying drawings.

What is claimed is:

1. A driver circuit of a semiconductor apparatus, comprising:
   a driver; and
   wherein the driver includes a transistor which is configured to receive a first power supply voltage through a bulk terminal and receive one of a second and third power supply voltage through a source terminal,
   a control unit configured to generate the first to third power supply voltages and selectively output one of the second and third power supply voltages to the source terminal of the transistor in response to a standby mode signal,
   wherein the second power supply voltage is higher than the first power supply voltage, and the third power supply voltage is lower than the first power supply voltage.

2. The driver circuit according to claim 1, wherein the driver receives the first power supply voltage through a gate terminal in a standby mode.

3. The driver circuit according to claim 1, wherein the control unit comprises:
   first to third voltage generators configured to generate the first to third power supply voltages; and
   a switch configured to select one of the second and third power supply voltages in response to the standby mode signal and output the selected voltage.

* * * * *